United States Patent

Sato et al.

[11] Patent Number: 5,985,471
[45] Date of Patent: Nov. 16, 1999

[54] MAGNETIC SENSOR

[75] Inventors: Masashige Sato; Atsushi Tanaka; Kazuo Kobayashi, all of Kawasaki, Japan

[73] Assignee: Fujitsu Limited, Kawasaki, Japan

[21] Appl. No.: 08/800,185

[22] Filed: Feb. 13, 1997

[30] Foreign Application Priority Data

Feb. 23, 1996 [JP] Japan .................................. 8-036145

[51] Int. Cl.⁶ ...................................................... G11B 5/66
[52] U.S. Cl. ................ 428/692; 428/694 R; 428/694 T; 428/694 TM; 428/684 TS; 428/900; 360/113; 324/252
[58] Field of Search ........................... 428/694 R, 694 T, 428/694 TM, 692, 800; 360/113; 324/252

[56] References Cited

U.S. PATENT DOCUMENTS

| | | | |
|---|---|---|---|
| 3,840,865 | 10/1974 | Holtzberg | 365/7 |
| 3,872,035 | 3/1975 | Holtzberg | 365/7 |
| 5,549,978 | 8/1996 | Iwasaki | 428/692 |

Primary Examiner—Leszek Kiliman
Attorney, Agent, or Firm—Armstrong, Westerman, Hattori, McLeland & Naughton

[57] ABSTRACT

The magnetic sensor comprise a multi-layer structure 10 including a ferromagnetic layer 12 of FeCo alloy, an insulation layer 14 of $Al_2O_3$ and a compound semiconductor layer 16 of GaAs. Circularly polarized light is irradiated to the compound semiconductor layer 16 to generate electrons. A dc voltage is applied to the ferromagnetic layer 12 and the compound semiconductor layer 16 by a dc power source 20 while circularly polarized light is irradiated to the compound semiconductor layer 16. When a direction of an external magnetic field changes, a magnetization direction of the ferromagnetic layer 12 accordingly changes, and a magnetoresistance between the ferromagnetic layer 12 and the compound semiconductor layer 16 changes. Changes of the magnetoresistance are measured by a voltmeter 22.

12 Claims, 6 Drawing Sheets

MAGNETIC SENSOR

BACKGROUND OF THE INVENTION

The present invention relates to a magnetic sensor for detecting magnetic fields, more specifically to a magnetic sensor which is suitably used in a magnetic read head of a magnetic recording apparatus.

With the recent high densities of the magnetic recording technique, relative speeds between magnetic recording media and read heads have much decreased. The conventional induction type read heads have found it difficult to have sufficient reading signals.

Then, in order that high reading signals are available at even the low relative speed, anisotropic magnetoresistive (AMR) effect magnetic heads for detecting magnetic fields themselves are developed. The anisotropic magnetoresistive effect is a phenomena that an electric resistance changes by some percentages corresponding to magnetized states of a magnetic substance. As materials of the anisotropic magnetoresistive effect magnetic heads (AMR magnetic heads), NiFe alloy (permalloy) is dominantly used.

However, AMR magnetic heads can have some percentage changes in the reading signals, and magnetic sensors having reading output changes of higher percentages. As such magnetic sensors are proposed giant magnetoresistive (GMR) effect magnetic sensors using giant magnetoresistive effect, ferromagnetic tunnel junction magnetic sensor using ferromagnetic tunnel junction, and others.

A ferromagnetic tunnel junction magnetic sensor includes a multi-layer body of a ferromagnetic layer/an insulating layer/ferromagnetic layer in which the insulating layer is sandwiched between the ferromagnetic layers. When a voltage is applied between the ferromagnetic layers to tunnel electrons, a tunneling probability of electrons changes depending on a relative angle of both ferromagnetic layers to a magnetization direction. This is because electron spin of one of the ferromagnetic layers, which supplies electrons is polarized, and electrons tunnel in the polarized state.

A change of the tunneling probability is given by a product of polarizabilities of both ferromagnetic layers. That is, a difference $\Delta R$ of a total resistance R between a maximum value and a minimum value is expressed by $$\Delta R/R = 2 \times P1 \times P2.$$

Accordingly, in the ferromagnetic tunnel junction magnetic sensor, one of the ferromagnetic layer is formed of a material having a larger coercive force, and the other ferromagnetic layer is formed of a material of a smaller coercive force. When an external magnetic field changes, a magnetization direction of the ferromagnetic layer of the larger coercive force does not change, but a magnetization direction of the ferromagnetic layer of the smaller coercive force changes to agree to a direction of the external magnetic field. As a result, when a magnetization direction of an external magnetic field changes, a relative angle between magnetization directions of both ferromagnetic layers changes, whereby a tunnel current changes, and the external magnetic field can be detected.

As described above, in the above-described ferromagnetic tunnel junction magnetic sensor it is necessary that one of the ferromagnetic layers is formed of a material having a large coercive force so that a magnetization direction does not change even when an external magnetic field changes. Accordingly, to use the ferromagnetic tunnel junction magnetic sensor as a magnetic read head, a material of the ferromagnetic layer is limited to a material, such as Fe, Co, Ni or others, a magnetization direction of which does not change. However, the polarizabilities of these materials are 10–40%, and in principle changes of tunneling probabilities have upper limits. The coercive forces of these materials are tens to hundreds Oe, and when a magnetic field of a higher than such coercive force is applied due to a cause, characteristics are adversely changed.

An object of the present invention is to provide a magnetic sensor which can overcome the above-described disadvantages, and has a high magnetoresistance ratio and is hard against disturbing magnetic fields.

SUMMARY OF THE INVENTION

The above-described object is achieved by a magnetic sensor comprising: a multi-layer body including a ferromagnetic layer, an insulation layer, and a GaAs-based compound semiconductor layer laid one on another; and irradiating means for irradiating circularly polarized light to the GaAs-based compound semiconductor layer of the multi-layer body, external magnetic fields being detected based on tunnel resistances between the ferromagnetic layer of the multi-layer body and the GaAs-based compound semiconductor layer thereof.

In the above-described magnetic sensor, it is preferable that the ferromagnetic layer of the multi-layer body comprises: a first ferromagnetic layer contacting the insulation layer; and a second ferromagnetic layer contacting the first ferromagnetic layer and having a smaller coercive force than the first ferromagnetic layer.

In the above-described magnetic sensor, it is preferable that a conducting layer is disposed on at least one side of the insulation film of the multi-layer body.

In the above-described magnetic sensor, it is preferable that the second ferromagnetic layer is formed of permalloy or zero magnetostrictive NiFeCo alloy.

In the above-described magnetic sensor, it is preferable that the first ferromagnetic layer is formed of Fe, Co, FeCo alloy or iron nitride.

In the above-described magnetic sensor, it is preferable that the conducting layer is formed of Al, Cu, Ag or Au.

In the above-described magnetic sensor, it is preferable that the insulation layer is formed of $Al_2O_3$, $SiO_2$, AlN, NiO or CoO.

As described above, according to the present invention, the compound semiconductor layer supplies polarized electrons, whereby the magnetic sensor can have high detectivity. It is unnecessary to use a ferromagnetic material having a large coercive force, whereby the magnetic sensor can be hard against disturbances.

According to the present invention, a first ferromagnetic layer having high polarizability is disposed in contact with the insulation layer which much influences magnetoresistance ratios, whereby high magnetoresistance ratios can be obtained. On the other hand, a second ferromagnetic layer is disposed on the first ferromagnetic layer having a small coercive force, whereby sufficient sensitivity can be obtained to small external magnetic fields.

DETAILED DESCRIPTION OF THE INVENTION

The magnetic sensor according to a first embodiment of the present invention will be explained with reference to FIGS. 1 to 3.

Figure 1:
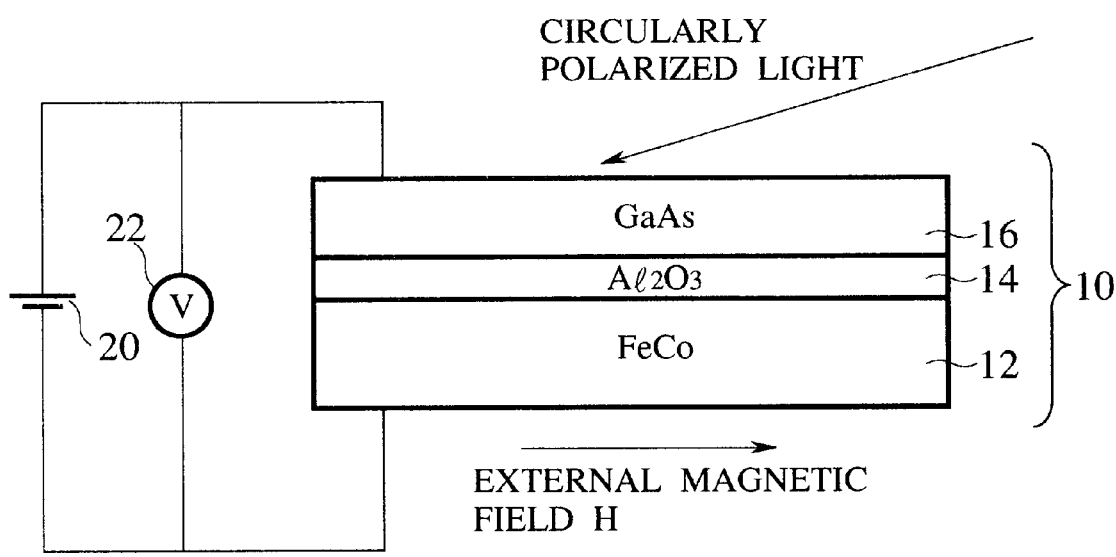
FIG. 1 is a view of the basic structure of the magnetic sensor according to a first embodiment of the present invention.

FIG. 1 is a view of the basic structure of the magnetic sensor according to the present embodiment. FIG. 2 is a graph of the result of the calculation of magnetic field dependence of magnetoresistance. FIG. 3 is a view of the magnetic sensor according to the present embodiment.

As shown in FIG. 1, the basic structure of the magnetic sensor according to the present embodiment is a multi-layer structure 10 comprising a ferromagnetic layer 12 of FeCo alloy, an insulation layer 14 of $Al_2O_3$, and a compound semiconductor layer 16 of GaAs.

The ferromagnetic layer 12 is formed of an about 10 nm-thick FeCo alloy layer of FeCo alloy, whose coercive force is 10 Oe, which is relatively low. The polarizability of the FeCo alloy is about 46%. When an external magnetic field changes, a magnetization direction of the ferromagnetic layer 12 changes to agree to a direction of the external magnetic field.

The insulation layer 14 is about 5 nm-thick $Al_2O_3$ layer which insulates the ferromagnetic layer 12 from the compound semiconductor layer 16.

The compound semiconductor layer 16 is an about 10 nm-thick GaAs layer. When circularly polarized light is irradiated to the GaAs layer, polarized electrons are generated as in the conventional ferromagnetic layer. The polarizability of the GaAs layer obtained when circularly polarized light is irradiated is 50%.

To generate a large polarization in the compound semiconductor layer 16, it is preferable to make circularly polarized light incident at an angle as small as possible, because a polarization takes place in the compound semiconductor layer in the direction of advance of irradiated circularly polarized light.

When an external magnetic field is detected, as shown in FIG. 1, a dc voltage is applied to the ferromagnetic layer 12 and the compound semiconductor layer 16 by a dc power source 20 while circularly polarized light is irradiated to the compound semiconductor layer 16. A voltage between the ferromagnetic layer 12 and the compound semiconductor layer 16 is measured by a voltmeter. When a direction of an external magnetic field changes, a magnetization direction of the ferromagnetic layer 12 accordingly changes, and a magnetoresistance between the ferromagnetic layer 12 and the compound semiconductor layer 16 changes. This magnetoresistance change is measured by the voltmeter 22.

Figure 2:
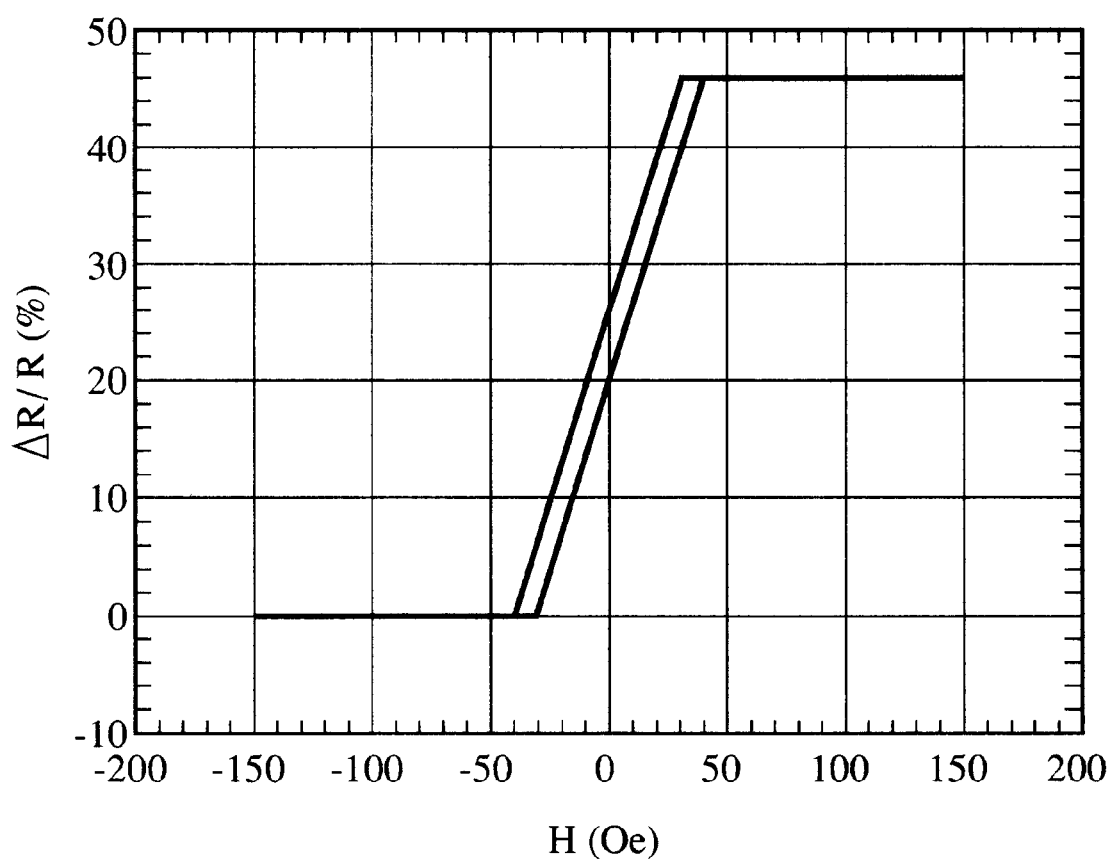
FIG. 2 is a graph of results of calculation of magnetic field dependence of the magnetoresistance of the magnetic sensor according to the first embodiment of the present invention.

FIG. 2 shows changes of a magnetoresistance ratio $\Delta R/R$ with changes of an external magnetic field H. As apparent in FIG. 2, a magnetoresistance ratio $\Delta R/R$ is 0% when an external magnetic filed H is −40 Oe, but when the external magnetic field H changes from −40 Oe to +40 Oe, the magnetoresistance ratio $\Delta R/R$ abruptly increases, and is 46% when the external magnetic field H is above 40 Oe.

The characteristics of the magnetoresistance ratio $\Delta R/R$ relative to the external magnetic field H slightly exhibit hysteresis.

Figure 3:
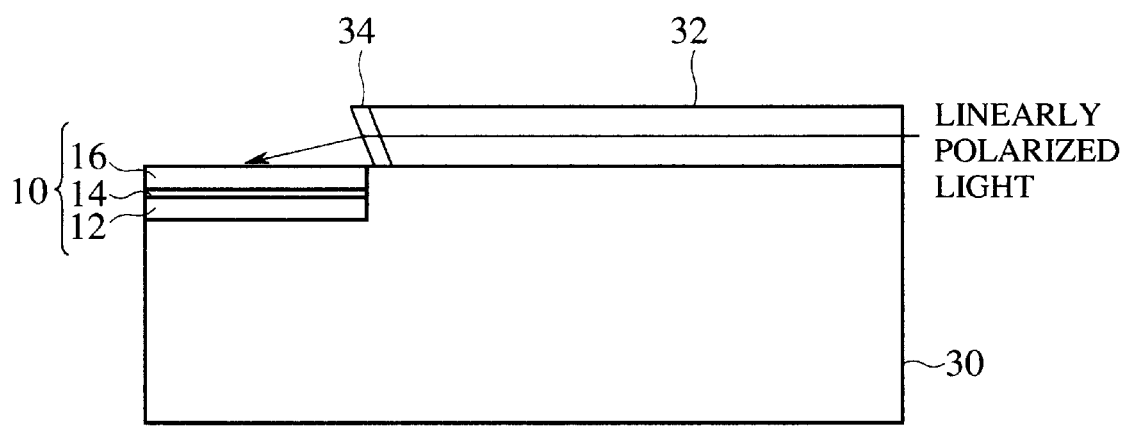
FIG. 3 is a view of the magnetic sensor according to the first embodiment of the present invention.

FIG. 3 shows a specific structure of the magnetic sensor using the basic structure of FIG. 1.

For example, the multi-layer body 10 of FIG. 1 is buried partially in the surface of a support substrate 30 of $Al_2O_3$—TiC with the compound semiconductor layer 16 exposed on the surface.

An optical waveguide 32 is formed on the surface of the support substrate 30 with one end faced to the multi-layer body 10. The end of the optical waveguide is cut slant so that light emitted from the optical waveguide 32 enters the surface of the compound semiconductor layer 16. A quarter-wave plate 34 is disposed on the end so that linearly polarized light is changed to circularly polarized light.

To detect an external magnetic field by the magnetic sensor, linearly polarized light enters the other end of the optical waveguide 32 and is changed to circularly polarized light by the quarter-wave plate to be irradiated to the compound semiconductor layer 16, and electric resistances between the compound semiconductor layer 16 of the multi-layer body 10 and the ferromagnetic layer 12 thereof is measured during the irradiation.

By preparing a structure in which the ferromagnetic layer 12 of the multi-layer body 10 of the magnetic sensor of FIG. 3 passes near a magnetic storage medium, a magnetic read head for reading magnetic states stored in the magnetic storage medium can be realized.

As described above, according to the present embodiment, the compound semiconductor layer can supply electrons having higher polarizabilities than the usual ferromagnetic materials do, whereby the magnetic sensor can have higher sensitivities than the conventional magnetic sensors. It is unnecessary to use a ferromagnetic material having coercive force, which makes the magnetic sensor hard against disturbances.

Figure 4:
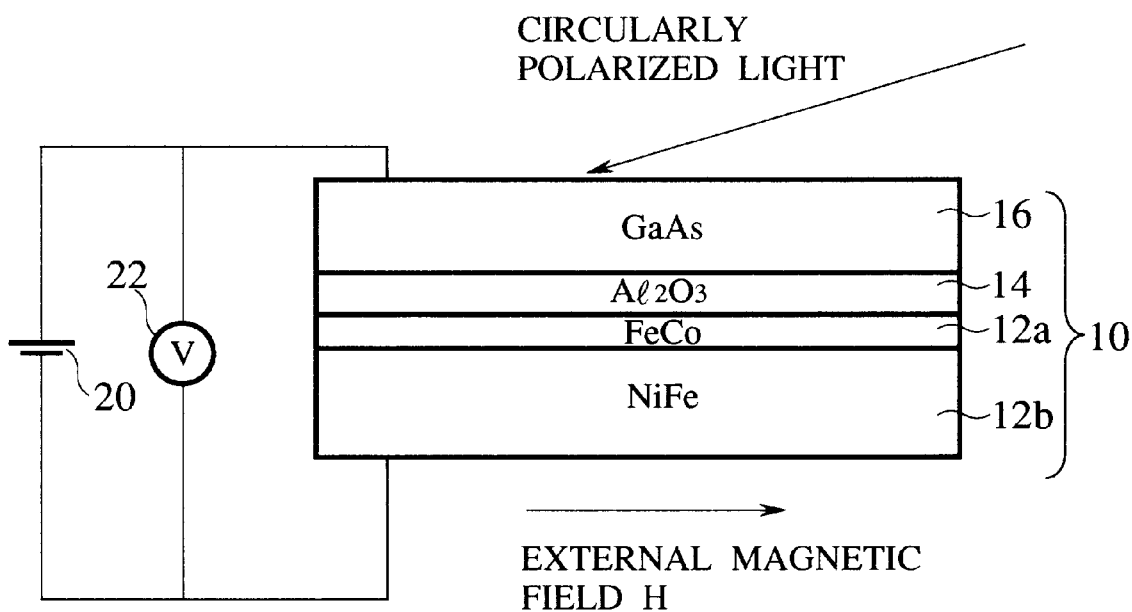
FIG. 4 is a view of the basic structure of the magnetic sensor according to a second embodiment of the present invention.

The magnetic sensor according to a second embodiment of the present invention will be explained with reference to FIG. 4. FIG. 4 is a view of the basic structure of the magnetic sensor according to the present embodiment. Common or the same members of the present embodiment with or as the first embodiment are represented by the same reference numerals not to repeat or simplify the description.

The basic structure of the present embodiment is characterized in that, as shown in FIG. 4, a ferromagnetic layer 12 is a two-layer structure including an about 2 nm-thick FeCo alloy layer 12a and an about 8 nm-thick NiFe alloy layer 12b. The FeCo alloy layer 12a is positioned on the side of an insulation layer 14.

FeCo alloy has an about 46% polarizability, which is high, and a 10 Oe coercive force, which is relatively small, and it cannot be said that FeCo alloy is sufficiently sensitive to small external magnetic fields. On the other hand, NiFe alloy has an about 18% polarizability, which is low, and a 0.1 Oe coercive force, which is very small, and is sufficiently sensitive to small external magnetic fields.

Then, in the present embodiment, the FeCo alloy layer 12a having high polarizability is disposed in contact with the insulation layer 14 which much influences the magnetoresistance ratio, whereby high magnetoresistance ratios are available. On the other hand, the NiFe alloy layer 12b having the small coercive force is disposed on the FeCo alloy layer 12a, whereby sufficient sensitivity to even small external magnetic fields is available.

Thus, the magnetic sensor according to the present embodiment can have high magnetoresistance ratios and is sufficiently sensitive to external magnetic fields.

Figure 5:
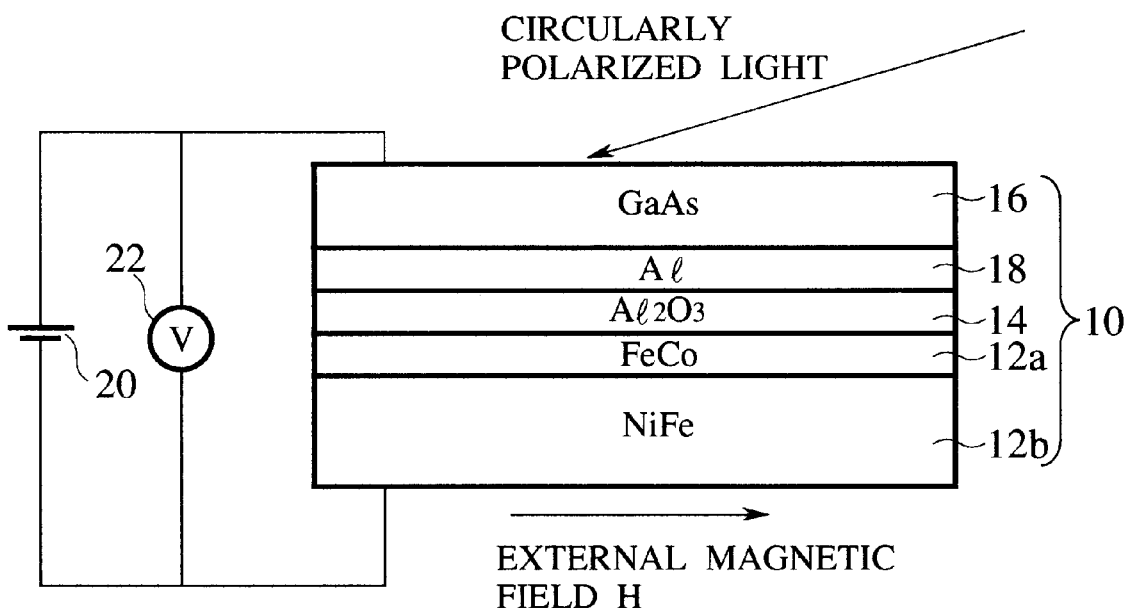
FIG. 5 is a view of the basic structure of the magnetic sensor according to a third embodiment of the present invention.

The magnetic sensor according to a third embodiment of the present invention will be explained with reference to FIG. 5. FIG. 5 is a view of the basic structure of the magnetic sensor according to the present embodiment. Common or the same members of the present embodiment with or as the magnetic sensor of FIG. 4 are represented by the same reference numerals not to repeat or simplify the description.

As shown in FIG. 5, the basic structure of the magnetic sensor according to the present embodiment comprises a conducting layer 18 of an about 3 nm-thick Al layer sandwiched between a compound semiconductor layer 16 of GaAs and an insulation layer 14 of $Al_2O_3$.

The conducting layer 18 is included in consideration of the method for fabricating the magnetic sensor.

In fabricating the multi-layer structure of the magnetic sensor, the compound semiconductor layer 16 is formed of a GaAs substrate, and the insulation layer 14, the ferromagnetic layers 12 (12a, 12b) are laid one on another in the stated order. However, it is very difficult to form the $Al_2O_3$ layer of the insulation film 14 directly on the GaAs substrate. In view of this, in the present embodiment, the Al layer of the conducting layer 18 is formed on the GaAs substrate, and then the surface of the Al layer is oxidized to form the $Al_2O_3$ layer of the insulation layer 14. The $Al_2O_3$ layer having good quality can easily form.

Furthermore, the insertion of the conducting film 18 does not deteriorate characteristics of the magnetic sensor. Polarized electrons generated in the compound semiconductor layer 16 pass through the conducting layer 18 as they are and never change their polarized state. Accordingly the magnetic sensor is prevented from changing the magnetoresistance to deteriorate the characteristics.

As described above, according to the present embodiment, the magnetic sensor can be simply fabricated without affecting the characteristics.

The present invention is not limited to the above-described embodiments and includes various modifications.

For example, in the present embodiments, the compound semiconductor layer is formed of GaAs layer but may be formed of any material as long as the material can generate polarized electrons by irradiation of circularly polarized light. For example, in place of the GaAs layer, a strained GaAs layer, or a superstructure of alternately laid GaAs thin layers can be used and AlGaAs thin layers. The polarizability of the strained GaAs layer is about 80%, and that of the superstructure is about 75%, which are higher than that of the GaAs layer.

In the above-described embodiments, the ferromagnetic layer contacting the insulation layer is formed of FeCo alloy having the high polarizability but may be formed of another ferromagnetic material, e.g., Fe (polarizability: 44%), Co (polarizability: 34%), iron nitride (polarizability: above 50%).

In the above-described embodiments, the ferromagnetic layer which is not in contact with the insulation layer is formed of NiFe alloy having the small coercive force but may be formed of another ferromagnetic material, e.g., zero magnetostrictive NiFeCo alloy (coercive force: about 1 Oe).

Figure 6:
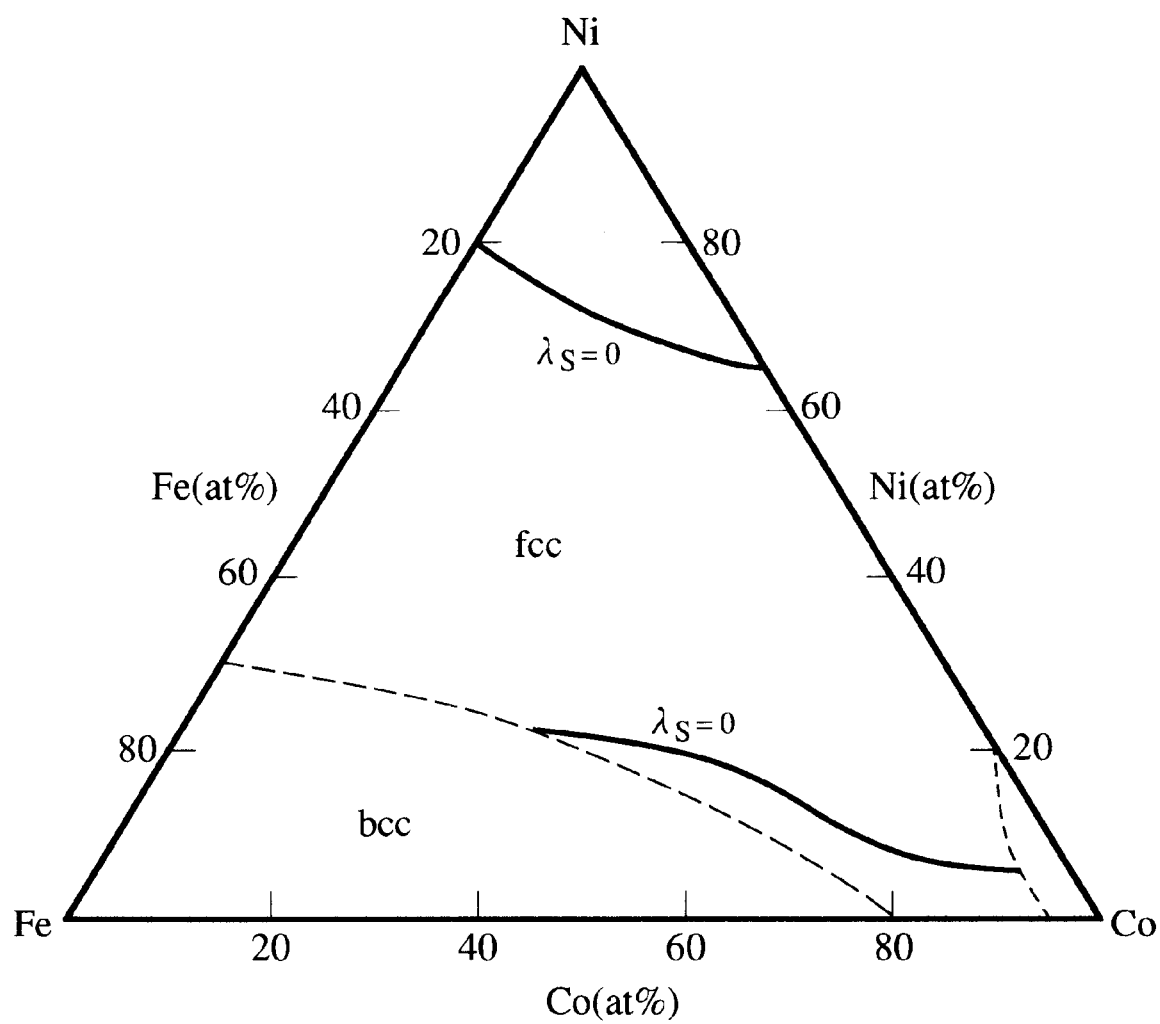
FIG. 6 is a graph of zero magnetostrictive compositions of NiFeCo ternary alloy.

Zero magnetostrictive NiFeCo alloy means alloys having compositions on the line $\lambda s=0$ in the graph of FIG. 6.

In the above-described embodiments, the insulation film is formed of $Al_2O_3$ but may be formed of another material, e.g., $SiO_2$, AlN, NiO or CoO.

In the above-described embodiments, the conducting layer is disposed on the side of the insulation layer where the compound semiconductor layer is disposed but may be disposed on the side of the ferromagnetic substance.

In the above-described embodiments, the conducting layer is formed of Al but may be formed of another material, e.g., Cu, Ag or Au.

What is claimed is:

1. A magnetic sensor comprising:

a multi-layer body including a ferromagnetic layer, an insulation layer, and a GaAs-based compound semiconductor layer laid one on another; and irradiating means for irradiating circularly polarized light to the GaAs-based compound semiconductor layer of the multi-layer body, external magnetic fields being detected based on tunnel resistances between the ferromagnetic layer of the multi-layer body and the GaAs-based compound semiconductor layer thereof.

2. A magnetic sensor according to claim 1, wherein the ferromagnetic layer of the multi-layer body comprises:

a first ferromagnetic layer contacting the insulation layer; and a second ferromagnetic layer contacting the first ferromagnetic layer and having a smaller coercive force than the first ferromagnetic layer.

3. A magnetic sensor according to claim 1, wherein a conducting layer is disposed on at least one side of the insulation film of the multi-layer body.

4. A magnetic sensor according to claim 2, wherein a conducting layer is disposed on at least one side of the insulation film of the multi-layer body.

5. A magnetic sensor according to claim 2, wherein the second ferromagnetic layer is formed of permalloy or zero magnetostrictive NiFeCo alloy.

6. A magnetic sensor according to claim 2, wherein the first ferromagnetic layer is formed of Fe, Co, FeCo alloy or iron nitride.

7. A magnetic sensor according to claim 3, wherein the conducting layer is formed of Al, Cu, Ag or Au.

8. A magnetic sensor according to claim 4, wherein the conducting layer is formed of Al, Cu, Ag or Au.

9. A magnetic sensor according to claim 1, wherein the insulation layer is formed of $Al_2O_3$, $SiO_2$, AlN, NiO or CoO.

10. A magnetic sensor according to claim 2, wherein the insulation layer is formed of $Al_2O_3$, $SiO_2$, AlN, NiO or CoO.

11. A magnetic read head comprising a magnetic sensor according to claim 1, the magnetic read head for reading magnetic states stored in magnetic storage media.

12. A magnetic read head comprising a magnetic sensor according to claim 2, the magnetic read head for reading magnetic states stored in magnetic storage media.

* * * * *